United States Patent
Weng et al.

(10) Patent No.: US 7,550,832 B2
(45) Date of Patent: Jun. 23, 2009

(54) STACKABLE SEMICONDUCTOR PACKAGE

(75) Inventors: Gwo-Liang Weng, Kaohsiung (TW); Yung-Li Lu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 170 days.

(21) Appl. No.: 11/636,971

(22) Filed: Dec. 12, 2006

(65) Prior Publication Data
US 2008/0042251 A1  Feb. 21, 2008

(30) Foreign Application Priority Data
Aug. 18, 2006  (TW)  ................ 95130539 A

(51) Int. Cl.
*H01L 23/02* (2006.01)
*H05K 7/00* (2006.01)

(52) U.S. Cl. .............. 257/685; 257/686; 257/724; 257/784; 257/E25.013; 257/E21.164; 361/777; 361/784; 361/780; 361/792

(58) Field of Classification Search ............ None
See application file for complete search history.

(56) References Cited

U.S. PATENT DOCUMENTS

| | | | |
|---|---|---|---|
| 6,451,624 B1 | 9/2002 | Farnworth et al. | |
| 6,501,165 B1 | 12/2002 | Farnworth et al. | |
| 6,521,881 B2 | 2/2003 | Tu et al. | |
| 6,593,662 B1 | 7/2003 | Pu et al. | |
| 6,614,101 B2 | 9/2003 | Misumi et al. | |
| 6,828,665 B2 | 12/2004 | Pu et al. | |
| 6,838,761 B2 | 1/2005 | Karnezos | |
| 6,861,288 B2 | 3/2005 | Shim et al. | |
| 7,071,568 B1 | 7/2006 | St. Amand et al. | |
| 7,354,800 B2 * | 4/2008 | Carson | 438/109 |
| 7,372,141 B2 * | 5/2008 | Karnezos et al. | 257/686 |
| 7,456,495 B2 * | 11/2008 | Pohl et al. | 257/686 |
| 2004/0056277 A1 | 3/2004 | Karnezos | |
| 2004/0124518 A1 | 7/2004 | Karnezos | |
| 2004/0262774 A1 | 12/2004 | Kang et al. | |
| 2005/0017340 A1 | 1/2005 | Shibue | |
| 2005/0133916 A1 | 6/2005 | Karnezos | |
| 2005/0248019 A1 | 11/2005 | Chao et al. | |
| 2007/0052089 A1 | 3/2007 | Kim et al. | |
| 2007/0096160 A1 | 5/2007 | Beroz et al. | |
| 2007/0246815 A1 | 10/2007 | Lu et al. | |

(Continued)

FOREIGN PATENT DOCUMENTS

KR  2004043739 A  *  5/2004

(Continued)

*Primary Examiner*—Alonzo Chambliss
(74) *Attorney, Agent, or Firm*—Volentine & Whitt, P.L.L.C.

(57) ABSTRACT

A stackable semiconductor package includes a top package, a bottom package, an adhesive layer, a plurality of wires and a molding compound. A part of a surface of a chip of the bottom package is exposed. The top package is inverted, and is adhered to the chip of the bottom package with the adhesive layer. The wires electrically connect a substrate of the bottom package and a substrate of the top package. The molding compound encapsulates the top package, the bottom package, the adhesive layer, and the wires, and exposes a part of a surface of the substrate of the top package. Thus, the stackable semiconductor package includes at least two chips, thereby increasing the chip density and improving the applicability.

13 Claims, 2 Drawing Sheets

U.S. PATENT DOCUMENTS

2008/0029869 A1    2/2008    Kwon et al.

FOREIGN PATENT DOCUMENTS

| TW | 507340 | 10/1999 |
| TW | 571420 | 1/2004 |
| TW | I227533 | 2/2005 |
| TW | I227924 | 2/2005 |
| TW | 200522303 A | 7/2005 |
| TW | I244175 | 11/2005 |
| TW | 200611305 A | 4/2006 |

* cited by examiner

STACKABLE SEMICONDUCTOR PACKAGE

BACKGROUND OF THE INVENTION

1. Field of the Invention

The present invention relates to a stackable semiconductor package, and more particularly, to a stackable semiconductor package having at least two chips.

2. Description of the Related Art

FIG. 1 is a schematic sectional view of a conventional stackable semiconductor package. The conventional stackable semiconductor package 1 includes a first substrate 11, a chip 12, a second substrate 13, a plurality of wires 14 and a molding compound 15. The first substrate 11 has a first surface 111 and a second surface 112. The chip 12 is attached to the first surface 111 of the first substrate 11 by flip-chip bonding. The second substrate 13 is adhered to the chip 12 with an adhesive layer 16. The second substrate 13 has a first surface 131 and a second surface 132, and the first surface 131 has a plurality of first pads 133 and a plurality of second pads 134 thereon. From the top view, the area of the second substrate 13 is greater than the area of the chip 12, such that some parts of the second substrate 13 extend out of the chip to form an overhanging portion.

The wires 14 electrically connect the first pads 133 of the second substrate 13 and the first surface 111 of the first substrate 11. The molding compound 15 encapsulates the first surface 111 of the first substrate 11, the chip 12, the wires 14, and a part of the second substrate 13, and exposes the second pads 134 on the first surface 131 of the second substrate 13, so as to form a mold area opening 17. Usually, the conventional stackable semiconductor package 1 can have another package 18 or other elements stacked in the mold area opening 17, in which solder balls 181 of the package 18 are electrically connected to the second pads 134 of the second substrate 13.

The conventional stackable semiconductor package 1 usually includes one chip only (i.e., the chip 12), so the application thereof is limited. Moreover, as the second substrate 13 has an overhanging portion, the first pads 133 are located on the periphery (i.e., the overhanging portion) of the corresponding position of the chip 12. The distance between the first pads 133 and the corresponding position of the edge of the chip 12 is defined as an overhanging length L1. Experiments show that if the overhanging length L1 is greater than three times the thickness T1 of the second substrate 13, the overhanging portion will sway or vibrate in wire bonding, which is disadvantageous to the wire bonding. Furthermore, during the wire bonding, the second substrate 13 may crack under a severe downward stress. Furthermore, due to the aforementioned sway, vibration or crack, the overhanging portion cannot be too long, such that the area of the second substrate 13 is limited and the layout space of the second pads 134 on the first surface 131 of the second substrate 13 is exposed by the mold area opening 17.

Therefore, it is necessary to provide a stackable semiconductor package to solve the above problems.

SUMMARY OF THE INVENTION

The objective of the present invention is to provide a stackable semiconductor package, which comprises a first substrate, a first chip, a plurality of first wires, a first molding compound, a second substrate, a second chip, a plurality of second wires, a second molding compound, an adhesive layer, a plurality of third wires, and a third molding compound. The first substrate has a first surface and a second surface. The first chip has a first surface and a second surface, and the second surface of the first chip is attached to the first surface of the first substrate. The first wires electrically connect the first surface of the first chip and the first surface of the first substrate. The first molding compound encapsulates a part of the first surface of the first substrate, the first wires, and a part of the first surface of the first chip.

The second substrate is disposed above the first chip. The second substrate has a first surface and a second surface, and the first surface of the second substrate includes a plurality of first pads and a plurality of second pads. The second chip has a first surface and a second surface, and the first surface of the second chip is attached to the second surface of the second substrate. The second wires electrically connect the second surface of the second chip and the second surface of the second substrate. The second molding compound encapsulates a part of the second surface of the second substrate, the second wires, and the second chip, and the second molding compound has a second surface. The adhesive layer is used to attach the second surface of the second molding compound to the area not encapsulated by the first molding compound on the first surface of the first chip. The third wires electrically connect the first pads on the first surface of the second substrate and the first surface of the first substrate. The third molding compound encapsulates the first surface of the first substrate, the first chip, the first molding compound, the second molding compound, and a part of the second substrate, and exposes the second pads on the first surface of the second substrate. Thus, the stackable semiconductor package includes at least two chips (i.e., the first chip and the second chip), thereby increasing the chip density and improving the applicability.

DETAILED DESCRIPTION OF THE INVENTION

Figure 1:
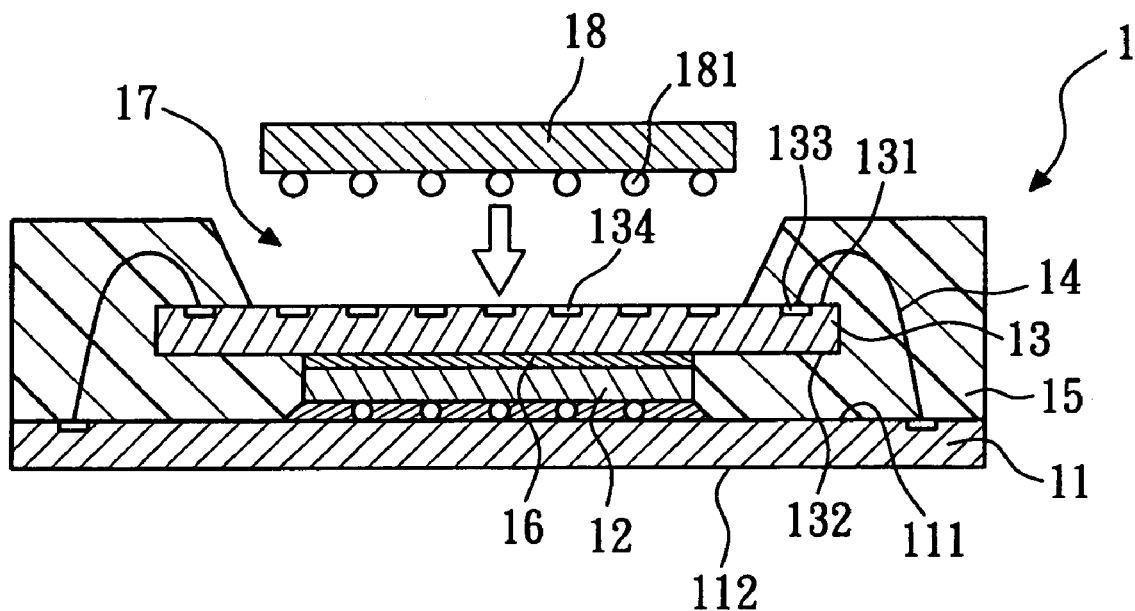
FIG. 1 is a schematic sectional view of a conventional stackable semiconductor package.
Figure 2:
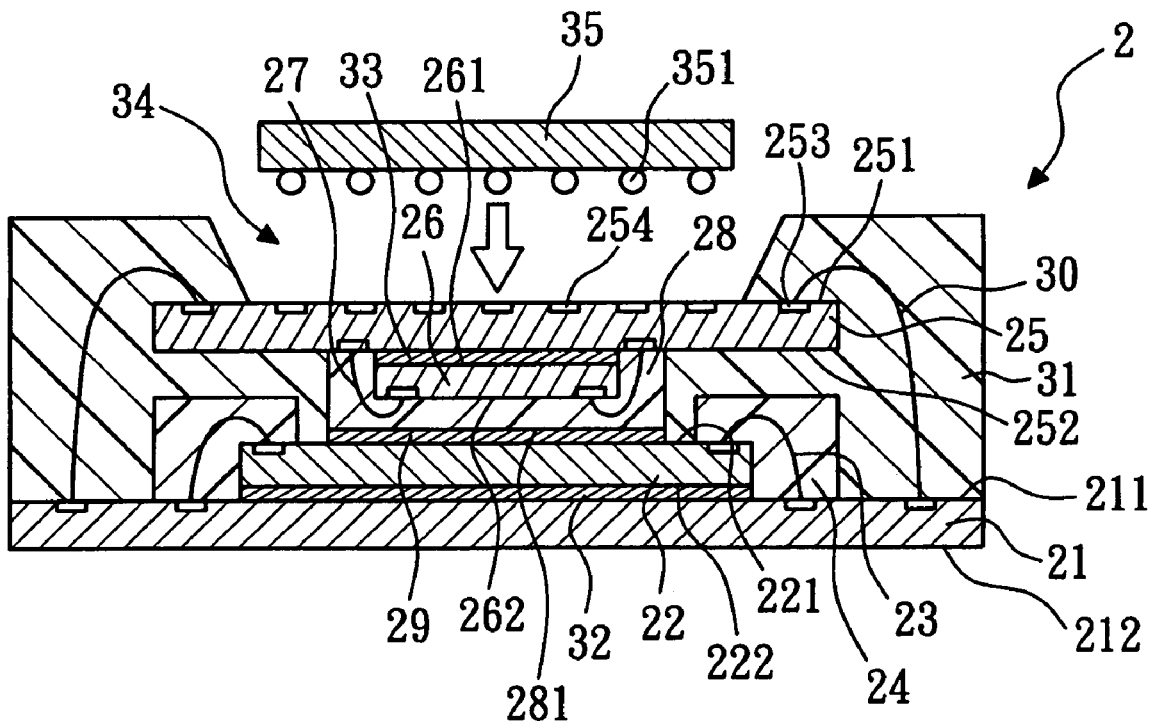
FIG. 2 is a schematic sectional view of a stackable semiconductor package according to a first embodiment of the present invention.

FIG. 2 is a schematic sectional view of a stackable semiconductor package according to a first embodiment of the present invention. The stackable semiconductor package 2 includes a first substrate 21, a first chip 22, a plurality of first wires 23, a first molding compound 24, a second substrate 25, a second chip 26, a plurality of second wires 27, a second molding compound 28, an adhesive layer 29, a plurality of third wires 30, and a third molding compound 31.

The first substrate 21 has a first surface 211 and a second surface 212. The first chip 22 has a first surface 221 and a second surface 222. The second surface 222 of the first chip 22 is adhered to the first surface 211 of the first substrate 21 with a first adhesive layer 32. The first wires 23 electrically connect the first surface 221 of the first chip 22 and the first surface 211 of the first substrate 21. The first molding compound 24 encapsulates a part of the first surface 211 of the first substrate 21, the first wires 23, and a part of the first surface 221 of the first chip 22. That is, the first molding compound 24 does not completely encapsulate the first surface 221 of the first chip 22, and a central region of the first surface 221 of the first chip 22 is exposed outside the first molding compound 24. In this embodiment, the first substrate 21, the first chip 22, the first wires 23, and the first molding compound 24 constitute a bottom package.

The second substrate 25 is disposed above the first chip 22. The second substrate 25 has a first surface 251 and a second surface 252, and the first surface 251 of the second substrate 25 includes a plurality of first pads 253 and a plurality of second pads 254. The second chip 26 has a first surface 261 and a second surface 262. The first surface 261 of the second chip is adhered to the second surface 252 of the second substrate 25 with a second adhesive layer 33. The second wires 27 electrically connect the second surface 262 of the second chip 26 and the second surface 252 of the second substrate 25. The second molding compound 28 encapsulates a part of the second surface 252 of the second substrate 25, the second wires 27, and the second chip 26. The second molding compound 28 has a second surface 281. In this embodiment, the second substrate 25, the second chip 26, the second wires 27, and the second molding compound 28 constitute a top package.

The adhesive layer 29 is used to adhere the second surface 281 of the second molding compound 28 to the region not encapsulated by the first molding compound 24 on the first surface 221 of the first chip 22. That is, during the fabrication, the top package and the bottom package are packaged separately, and then the top package is inverted by 180 degrees and is adhered to the bottom package with the adhesive layer 29.

The third wires 30 electrically connect the first pads 253 on the first surface 251 of the second substrate 25 and the first surface 211 of the first substrate 21. The third molding compound 31 encapsulates the first surface 211 of the first substrate 21, the first chip 22, the first molding compound 24, the second molding compound 28, and a part of the second substrate 25, and exposes the second pads 254 on the first surface 251 of the second substrate 25, so as to form a mold area opening 34. Usually, the stackable semiconductor package 2 can have another package 35 or other elements stacked in the mold area opening 34, and solder balls 351 of the package 35 are electrically connected to the second pads 254 of the second substrate 25.

The stackable semiconductor package 2 includes at least two chips (i.e., the first chip 22 and the second chip 26), thereby increasing the chip density and improving the applicability.

Figure 3:
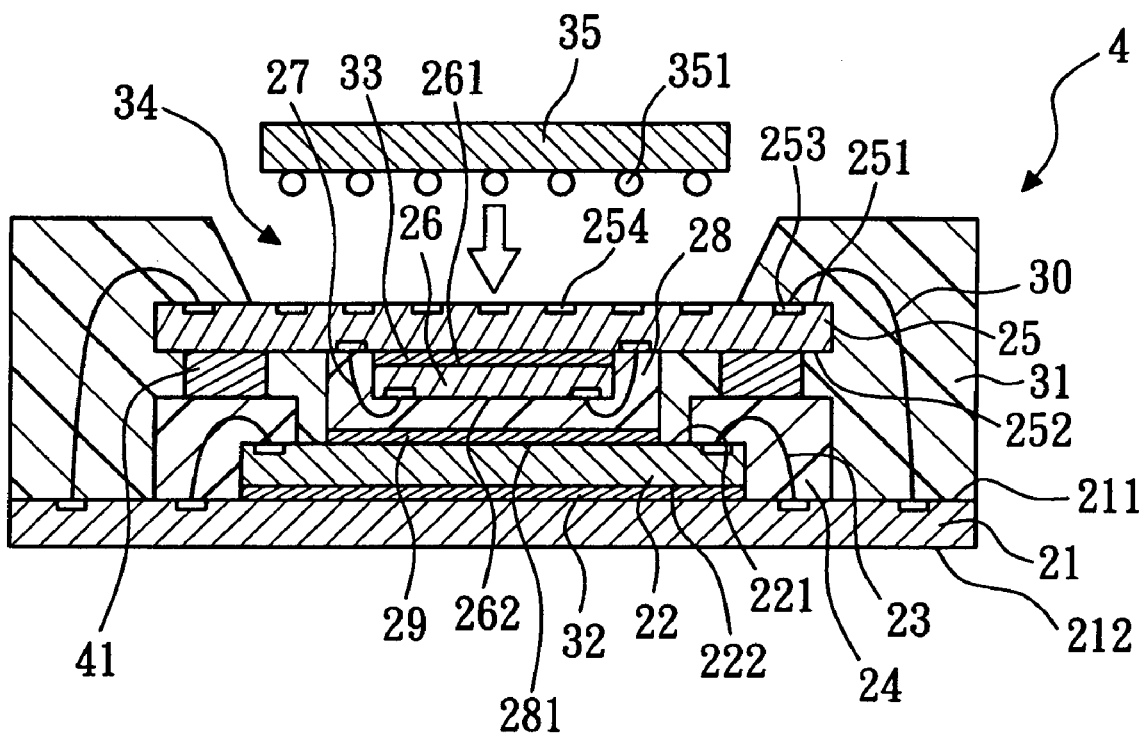
FIG. 3 is a schematic sectional view of a stackable semiconductor package according to a second embodiment of the present invention.

FIG. 3 is a schematic sectional view of a stackable semiconductor package according to a second embodiment of the present invention. The stackable semiconductor package 4 of this embodiment is substantially the same as the stackable semiconductor package 2 of the first embodiment, and only the difference is described herein. The like element numerals are used to indicate like elements appearing in the embodiments. A design of supporting element 41 is added into the stackable semiconductor package 4 of this embodiment, and the supporting element 41 has the following advantages. Viewed from the top, the area of the second substrate 25 is greater than the area of the second molding compound 28, so some parts of the second substrate 25 extend out of the second molding compound 28 to form an overhanging portion. The first pads 253 are located on the periphery of the corresponding position of the second molding compound 28 (i.e., the overhanging portion), and the distance between the first pads 253 and the corresponding position of the edge of the second molding compound 28 is defined as an overhanging length L2. During the wire bonding of the third wires 30, the overhanging portion of the second substrate 25 may sway, thus causing troubles to the wire bonding. Therefore, the supporting element 41 is disposed below the second surface 252 of the second substrate 25, so as to support the second substrate 25. In this embodiment, being supported by the supporting element 41, the overhanging portion of the second substrate 25 will not sway or vibrate in wire bonding even if the overhanging length L2 is greater than three times the thickness T2 of the second substrate 25.

In this embodiment, the supporting element 41 is disposed between the first molding compound 24 and the second surface 252 of the second substrate 25. However, it can be understood that the supporting element 41 can also be disposed between the first surface 221 of the first chip 22 and the second surface 252 of the second substrate 25, or between the first surface 211 of the first substrate 21 and the second surface 252 of the second substrate 25.

In this embodiment, the supporting element 41 is an annular sidewall, which encloses a space to accommodate the second molding compound 28. In this embodiment, the supporting element 41 is a fourth molding compound formed by means of pre-molding. In other applications, the supporting element 41 is an underfill material formed by means of adhesive dispensing.

Figure 4:
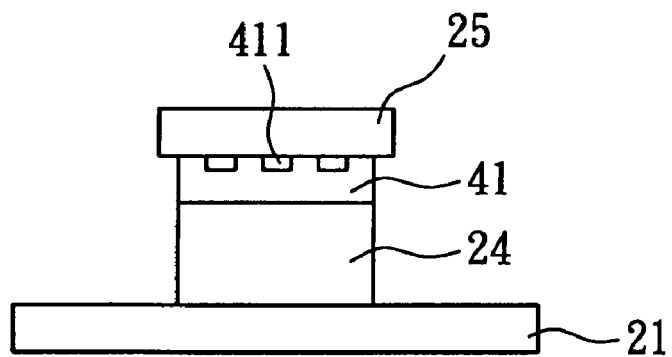
FIG. 4 is a schematic side view of the stackable semiconductor package of FIG. 3 with the third molding compound and the third wires omitted.

FIG. 4 is a schematic side view of the stackable semiconductor package of FIG. 3 with the third molding compound and the third wires omitted. In this embodiment, a plurality of through holes 411 is disposed in the sidewall of the supporting element 41, so as to facilitate the flow of the third molding compound 31. In other applications, the through holes 411 penetrate through the sidewall of the supporting element 411 from top to bottom, such that the supporting element 411 is formed by a plurality of discontinuous sidewalls. Similarly, the discontinuous sidewalls also enclose a space to accommodate the second molding compound 28.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A stackable semiconductor package, comprising:
   a first substrate having a first surface and a second surface;
   a first chip having a first surface and a second surface, wherein the second surface of the first chip is attached to the first surface of the first substrate;
   a plurality of first wires electrically connecting the first surface of the first chip and the first surface of the first substrate;
   a first molding compound encapsulating a part of the first substrate, the first wires, and exposing a central portion of the first chip of the first surface of the first chip;
   a second substrate disposed above the first chip, the second substrate having a first surface and a second surface, and the first surface of the second substrate having a plurality of first pads and a plurality of second pads;
   a supporting element disposed below the second surface of the second substrate for supporting the second substrate and mounted on the first molding compound;
   a plurality of third wires electrically connecting the first pads on the first surface of the second substrate and the first surface of the first substrate; and
   a third molding compound encapsulating the first surface of the first substrate, the first chip, the first molding compound and a part of the second substrate, and exposing the second pads on the first surface of the second substrate.

2. The stackable semiconductor package as claimed in claim 1, wherein the second surface of the first chip is adhered to the first surface of the first substrate via a first adhesive layer.

3. The stackable semiconductor package as claimed in claim 1, further comprising:
   a second chip having a first surface and a second surface, wherein the first surface of the second chip is attached to the second surface of the second substrate;
   a plurality of second wires electrically connecting the second surface of the second chip and the second surface of the second substrate;
   a second molding compound encapsulating a part of the second surface of the second substrate, the second wires, and the second chip, the second molding compound having a second surface; and
   an adhesive layer for adhering the second surface of the second molding compound to a region not encapsulated by the first molding compound on the first surface of the first chip.

4. The stackable semiconductor package as claimed in claim 3, wherein the first surface of the second chip is adhered to the second surface of the second substrate by a second adhesive layer.

5. The stackable semiconductor package as claimed in claim 1, wherein the supporting element is disposed between the first molding compound and the second surface of the second substrate.

6. The stackable semiconductor package as claimed in claim 1, wherein the supporting element is disposed between the first surface of the first chip and the second surface of the second substrate.

7. The stackable semiconductor package as claimed in claim 1, wherein the supporting element is disposed between the first surface of the first substrate and the second surface of the second substrate.

8. The stackable semiconductor package as claimed in claim 1, wherein the supporting element is a fourth molding compound which is a pre-molded molding compound.

9. The stackable semiconductor package as claimed in claim 1, wherein the supporting element is a dispensed underfill material.

10. The stackable semiconductor package as claimed in claim 1, wherein the supporting element is an annular sidewall enclosing a space, and the sidewall has a plurality of through holes for facilitating flow of the third molding compound.

11. The stackable semiconductor package as claimed in claim 1, wherein the supporting element comprises a plurality of discontinuous sidewalls enclosing a space.

12. The stackable semiconductor package as claimed in claim 1, wherein the first pads are disposed on a periphery of a corresponding position of a second molding compound.

13. The stackable semiconductor package as claimed in claim 12, wherein a distance between the first bonding pads and the corresponding position of the second molding compound is defined as an overhanging length which is greater than three times a thickness of the second substrate.

* * * * *